United States Patent [19]

Roman

[11] 4,334,950
[45] Jun. 15, 1982

[54] ADVANTAGEOUS FABRICATION TECHNIQUE FOR DEVICES RELYING ON MAGNETIC PROPERTIES

[75] Inventor: Bernard J. Roman, Summit, N.J.

[73] Assignee: Bell Telephone Laboratories, Incorporated, Murray Hill, N.J.

[21] Appl. No.: 230,255

[22] Filed: Jan. 30, 1981

Related U.S. Application Data

[63] Continuation of Ser. No. 58,297, Jul. 17, 1979, abandoned.

[51] Int. Cl.³ .............................................. B44C 1/22
[52] U.S. Cl. .................................. 156/643; 156/659.1
[58] Field of Search .......................... 427/48, 127–132; 428/900 MS File; 156/652, 653, 655, 657, 644, 3, 8, 11, 17, 659.1, 643

[56] References Cited

U.S. PATENT DOCUMENTS 4,045,594  8/1977  Maddocks .......................... 427/90 X

*Primary Examiner*—Bernard D. Pianalto
*Attorney, Agent, or Firm*—Bruce S. Schneider

[57] ABSTRACT

A process for producing devices, e.g., magnetic bubble devices, with planar geometries yields advantageous properties. The process includes depositing a material such as a photolithographic resist in a desired pattern on an electrically insulating substrate, e.g., $SiO_2$, etching the exposed areas of the insulating material, depositing an appropriate metal onto the etched regions, and then lifting off the initial resist deposition.

9 Claims, 11 Drawing Figures

FIG. 10   FIRST PATTERN LAYER
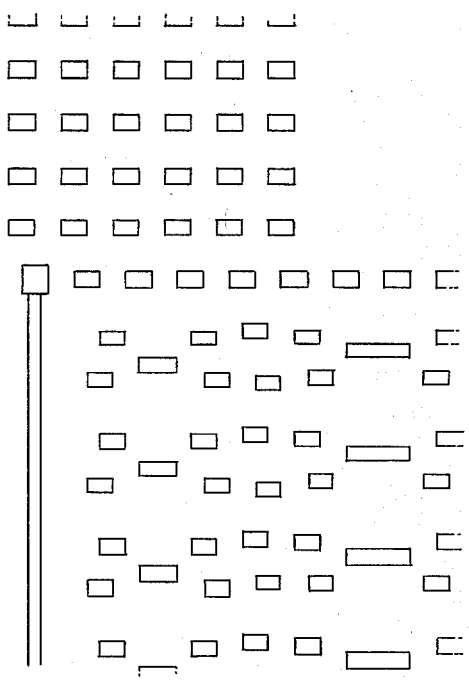
FIG. 11   SECOND PATTERN LAYER
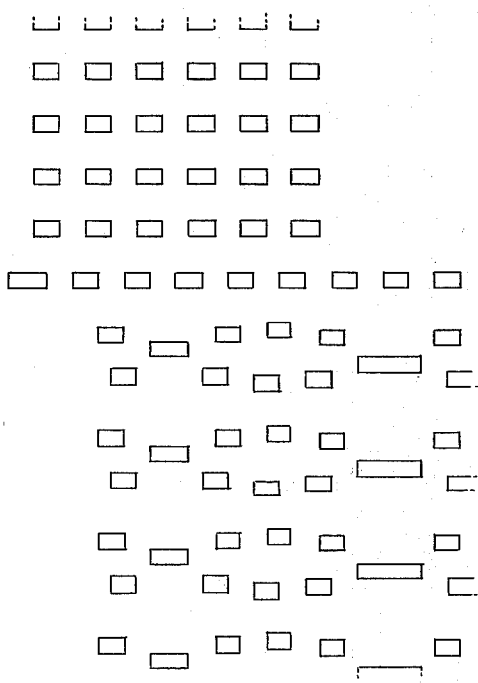

ADVANTAGEOUS FABRICATION TECHNIQUE FOR DEVICES RELYING ON MAGNETIC PROPERTIES

This is a continuation of application Ser. No. 58,297, filed July 17, 1979, abandoned.

BACKGROUND OF THE INVENTION

1. Field of the Invention

This invention relates to devices relying on magnetic properties and, more particularly, to the fabrication of these devices.

2. Art Background

Devices relying on magnetic properties often require the deposition of a metal film during their fabrication. For example, in the case of magnetic bubble devices, an aluminum alloy is deposited on a silicon dioxide layer that, in turn, overlays the magnetic garnet epilayer. These metallic films are often patterned to produce a desired result in a localized area of the device. In the example of magnetic bubble devices, the aluminum alloy does not cover the entire silicon dioxide layer, but is confined to areas where control functions are performed, e.g., the metal film is patterned to induce bubble nucleation, replication or transfer in a particular area of the magnetic garnet film at a given instant in time.

Since the metallic films utilized are not continuous, but are localized in particular areas of the devices, subsequent deposited layers will not fill in the steps produced by this localization. Thus, continuing the example of magnetic bubble devices, if another silicon dioxide layer is deposited over the aluminum alloy, this silicon dioxide layer will not be planar, but will have depressions in areas where the underlying aluminum alloy is absent.

This non-planar structure, although usually unimportant in semiconductor devices, often becomes significant in devices which rely on magnetic properties. Since magnetization is a three dimensional effect, a film that is not planar experiences magnetic gradients through its cross-section. For example, in the case of magnetic bubble devices if a permalloy alloy is deposited on a stepped silicon dioxide film, this permalloy alloy is similarly non-planar. When magnetic fields are introduced to operate the device various areas of the permalloy strip experience spurious magnetic effects. This results in a degree of device unreliability. (See, for example, W. Strauss, *Journal of Applied Physics*, 49 1897 (1978).)

Various fabrication schemes have been developed to produce a planar geometry in devices relying on magnetic properties. For example, Yamagishi has described (Third U.S.A.-Japan Computer Conference. Oct. 10th through 12th, 1978, Session 20-3-1) a method of forming a planar geometry on an underlying substrate. This process is schematically illustrated in FIG. 1. The first step, 1 in FIG. 1, includes the deposition of an aluminum alloy, 8, upon the substrate, which is a silicon oxide, 7, coated magnetic epilayer, 9. In the second step, 2, a resist material, 11, is deposited on the alloy which in the third step, 3, is etched in the exposed areas, 12. A layer of silicon monoxide, 14, is then deposited on the substrate thus covering both the resist and the exposed areas of the aluminum alloy. The resist is then lifted off and the planar geometry, 5, is obtained.

A comparison of FIG. 1 which shows the Yamagishi technique and FIG. 2 which shows the steps required in the conventional non-planar production method demonstrates that an additional step involving the deposition of a silicon monoxide layer is required. Obviously, this additional step leads to associated production difficulties and costs. Other proposed methods for fabricating devices with planar geometries require even more processing steps with their associated costs and difficulties. (See, for example, Rose, *IEEE Transactions on Magnetics*, MAG-12, (6), 618, (1976), and Reekstin, et al, *IEEE Transactions on Magnetics*, MAG-9, (3), 485 (1973).) Thus, although the desired planar geometries have been achieved, this achievement requires significantly increased processing costs.

SUMMARY OF THE INVENTION

Devices relying on magnetic properties and having planar geometries have been produced without increasing the number of processing steps necessary for device fabrication. This technique involves in the preferred embodiment the deposition of a resist material in a desired pattern on an electrically insulating layer. Etching of the exposed surface of the insulating layer is then performed. The exposed layer, and thus also the resist layer, is coated with the metal to be deposited such as an aluminum/copper alloy. The resist material is then lifted off giving the desired geometry. A second electrically insulating layer is then deposited before further processing of the device.

BRIEF DESCRIPTION OF THE DRAWING

FIGS. 4 through 11 illustrate the practice of a preferred embodiment of the invention.

DETAILED DESCRIPTION

For pedagogic purposes, the invention will be described in terms of the production of a magnetic bubble device. However, it should be understood that the subject invention is not limited to the production solely of such devices and is generally applicable to devices which require the fabrication of a planar geometry.

Figure 3:
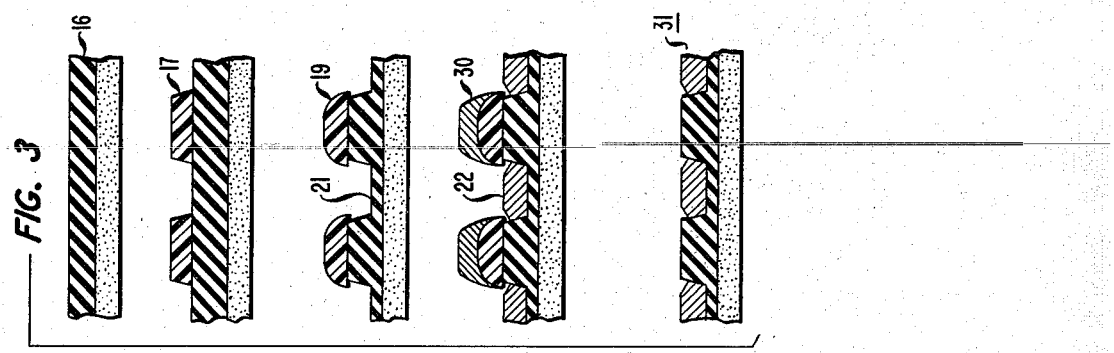
FIG. 3 is a schematic representation of an embodiment of the subject inventive process.
Figure 2:
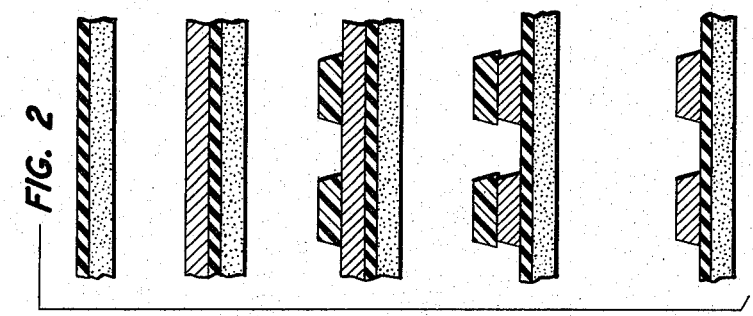
FIGS. 1 and 2 are schematic representations of fabrication processes which have been utilized in the production of devices relying on magnetic properties.
Figure 1:
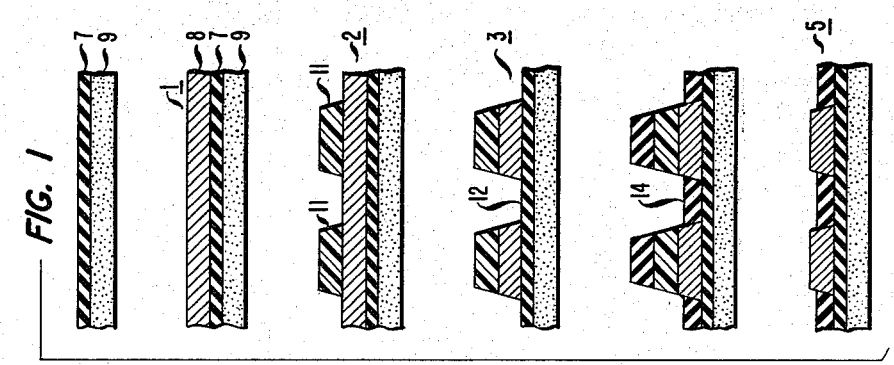
Figure 4:
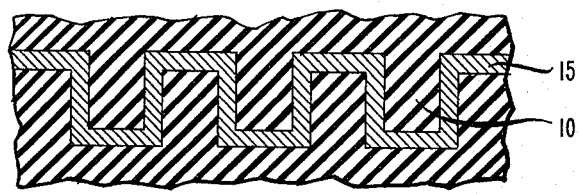

The subject process is performed on an electrically insulating layer, 16, in FIG. 3 (FIG. 3 illustrates the steps in the preferred embodiment of the invention) which is susceptible to etching. For example, in the preferred embodiment a silicon dioxide layer typically deposited on the epilayer of a magnetic garnet is utilized. (See for example, S. L. Blank and J. W. Nielsen, *Journal of Crystal Growth*, 17, 302 (1972), and S. L. Blank et al, *Journal of the Electrochemical Society*, 123, 876 (1976), for conventional fabrication techniques involved in depositing garnet epilayers and D. C. Bullock, et al, *IEEE Transactions on Magnetics*, MAG-12, 654 (1976) for techniques used in the subsequent deposition of a silicon dioxide layer.) This layer is primarily employed as an electrical insulator. The insulation required is between portions of the metallic pattern which are subsequently deposited. As noted, in many devices metallic patterns are deposited on a substrate in order to produce local effects such as nucleation in the substrate. Obviously, if an electrically conducting layer is used directly on the substrate, all portions of the subsequently deposited metallic pattern will be electrically continuous. Thus, if the underlying layer is not insulating, it is impossible to direct a single electrical signal to a specific portion of the metallic pattern, and thus, it is impossible to localize specific desired functions. The necessary electrical isolation provided by the insulator depends on the application desired. Typically, it is advantageous to limit current flow through the insulator to $10^{-6}$ of that through the metal pattern. That is, as shown in FIG. 4, the current through the portion marked, 10, which is the insulator should be at least $10^{+6}$ less than the current through the electrical conductor, 15. For most patterns utilized in conventional devices, the cross-sectional area and length of the metal is approximately equal to that of the insulator. Therefore, generally to achieve this desired criterion, it is sufficient to chose an insulator whose resistivity is at least $10^{+6}$ of the resistivity demonstrated by the particular metal utilized. Obviously, if there is a large difference between the width of the insulating layer between various portions of the metal pattern and the width of the metal pattern itself appropriate corrections must be made to this general criterion. Most commonly recognized insulators satisfy this criterion. Typically, silicon dioxide is a convenient insulating material.

The insulating region described is also used as a method of reducing strain gradients in the underlying substrate. For example, in certain circumstances when metals are deposited and patterned directly on a garnet layer, strain gradients can arise from the patterned interruption of the inherent metallization strain. (See, for example, Dishman, et al, *Journal of Applied Physics*, 45, (9), 4076 (1974).) These strain gradients are directly transferred to the magnetic epilayer. The use of an intermediary layer reduces the strain gradients and, therefore, reduces any disadvantageous results which might occur. The necessity for this strain isolation will be further discussed in conjunction with the etching step.

A delineating material, 17 in FIG. 3, is then introduced as a mask onto the electrical insulating layer in a desired pattern. The pattern chosen should be the negative of the pattern desired for the metallic layer that is ultimately to be deposited. Typical of delineating materials are photoresists, for example, polymeric resists. The patterning of delineating material on an electrical insulating layer is well-known and adequately described in a variety of publications. (See, for example, *Journal of the Electrochemical Society*, 120, 140 (1973).) Once these resists are deposited in the desired pattern they are advantageously heated (generally to approximately 120 degrees C.) to produce a rounding as indicated by 19 in FIG. 3. The rounding to be most advantageous should have a radius approximately equal to or greater than the thickness of the film. This rounding allows more complete filling of the etch pit produced in the subsequent etching step. If the expedient of rounding the delineating material edge is utilized, the thickness of the delineating material is not critical. Typically, delineating material of thicknesses between 0.5 and 1.5 $\mu$m is utilized. Thinner material usually provides the better resolution. However, as a practical limit to insure continuity of the delineating material a thickness less than 0.5 $\mu$m is generally not desirable. If the material is thicker than 1.5 $\mu$m resolution better than 1.5 $\mu$m generally is not obtainable. If patterns having detail requiring resolution poorer than this resolution limit are acceptable, thicker layers are usable. However, for typical devices resolution greater than 1.5 $\mu$m is necessary to produce the desired pattern and, therefore, thicknesses of the delineating material less than 1.5 $\mu$m, preferably less than 1 $\mu$m, are generally necessary. If the expedient of rounding the edges is not utilized, the thickness of the delineating material is somewhat more significant. Without the rounding procedure, generally for resolutions greater than 2 $\mu$m, thicknesses less than 1 $\mu$m should be utilized.

In the two steps following deposition of a delineating material, pits 21 in FIG. 3, are etched in the exposed area of the electrically insulating material and then the desired metal, 22 in FIG. 3, is deposited in these pits. The depth of the pits and the thickness of the metal ultimately deposited are to an extent interdependent. As previously mentioned, these pits are not necessarily etched entirely through the electrically insulating layer. Transfer of patterned strain to the magnetic garnet film is reduced when such pits do not completely penetrate the silicon dioxide layer thickness. However, the use of pits which do extend completely through this layer is possible. Generally, in a preferred embodiment, the electrically insulating layer is etched so that approximately between 1000 Å and 4000 Å of the layer remains. Although plasma etching techniques are found advantageous for silicon dioxide electrical insulating layers, other etching techniques that are compatible with silicon dioxide or other insulating layers are not precluded.

The metallized layer is then deposited after the etching is completed. Conventional vacuum deposition techniques are utilized. For example, in the case of an aluminum/copper alloy, the material is deposited by electron beam evaporation. In the preferred embodiment, an alloy of 95.5 weight percent aluminum and 4.5% copper is deposited by this evaporation technique. The thickness of the metallic layer must be chosen so that it is possible to remove the delineating material in a subsequent processing step. Additionally, the thickness must be chosen so that an essentially planar geometry results. These two requirements are met by maintaining the appropriate ratio between $Y_p$, (see FIG. 5) the depth of the etched pit, and $Y_M$, (see FIG. 6) the thickness of the metallized layer. The appropriate criteria is that $4/3 \geq Y_M/Y_p \geq \frac{1}{2}$. This insures that the surface of the metallized layer is sufficiently proximate to the level of the surface of the insulating electrical layer to produce a planar geometry as well as assure the subsequent removal of the delineating material. Deviations greater than those specified produce unacceptably non-planar features when the subsequent insulating electrical layer is deposited.

Figure 5:
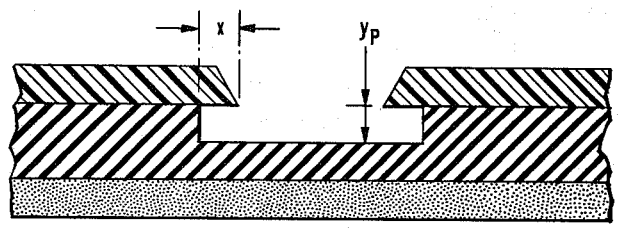
Figure 6:
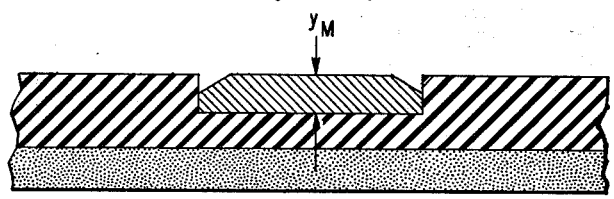
Figure 7:
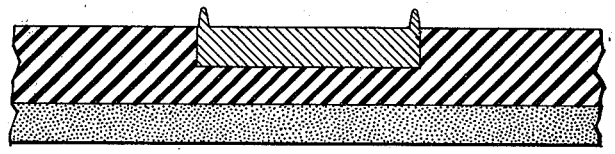

The undercut, i.e., the area denoted X in FIG. 5 also must be sufficient to allow the removal of the resist by an expedient method such as liftoff during subsequent processing steps. This criteria is satisfied when $1.5 \geq X/Y_p \geq \frac{1}{3}$. When this relationship is adhered to, structures such as shown in FIG. 6 instead of those as shown in FIG. 7 are obtained.

The delineating material is then removed by an expedient technique, e.g., liftoff. For example, in the case of photolithographic resists a suitable solvent is utilized to cause the degradation of the resist film. As can be seen in FIG. 3, when the metal is deposited in the etched areas a metal film, 30, is also deposited on the resist material. For typical metals such as aluminum or aluminum alloys, this overlying metal film does not hinder the resist removal. However, caution should be taken that metals and resist combinations are not employed which prevent the removal of the resist material.

The results of this process is the planar geometry, 31, shown in FIG. 3. The entire structure is then covered by a second layer of an electrically insulating material. In the preferred embodiment of production of a magnetic bubble device another metal layer is then deposited on this second electrically insulating layer. This second metal layer is utilized as an expedient to produce propagation in the garnet epilayer. Permalloy patterns, (see Yamagishi, supra) or dual conductor patterns, (see A. H. Bobeck U.S. Pat. No. 4,162,537, issued July 24, 1979, from U.S. patent application No. 914,959, filed June 12, 1978), are compatible with the subject technique. The following examples illustrate typical processing parameters used in employing the subject invention:

EXAMPLE 1

Figure 8:
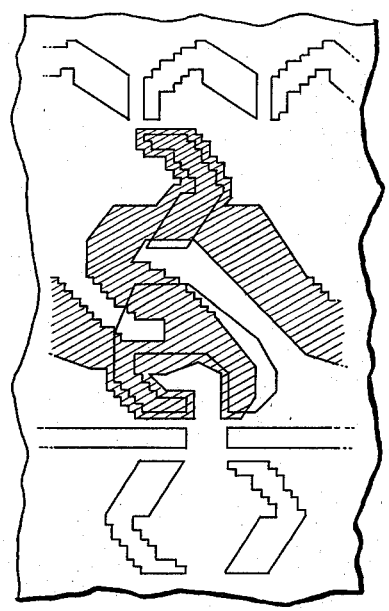

An epilayer having a composition described in Blank et al, *Journal of Applied Physics*, 50, 2155 (1979), and having a 5000 Å thick Rf sputter deposited silicon dioxide cover layer was utilized. An Rf power of 1.2 w/cm$^2$ using 13.56 MHz excitation radiation was employed to deposit the $SiO_2$. The sputtering target was fused quartz. The silicon dioxide surface thus obtained was cleaned by brushing with a water detergent solution. A 7500 Å thick layer of Shipley AZ1350B resist (a proprietary product of Shipley Corporation, Newton, Mass. which is a positive acting phenolic base resist) was uniformly spun coated onto the exposed face of the silicon dioxide layer. The resist was baked at 85 degrees C. for one-half hour in an air oven. To produce a replicate function on this epilayer, the resist was exposed through a mask using nominal 4000 Å radiation. The mask allowed exposure of all the shaded regions shown in FIG. 8. (The shaded regions of FIG. 8 indicate the pattern of aluminum/copper replicate function. The remaining structures shown in this figure are the overlying permalloy pattern.) The exposure was continued until it reached 80 m-Joule/cm$^2$. The exposed resist was spray developed using Shipley AZ developer (a proprietary product of Shipley Corporation, Newton, Massachusetts, which is primarily composed of an aqueous solution of sodium hydroxide and sodium silicate). The developed resist was rinsed in deionized water and spun dry.

The developed resist was then further dried by baking in an air oven at 100 degrees C. for 20 minutes. The sample was placed vertically in the sample holder of a commercial plasma etching apparatus. The pressure was reduced below 1 Torr in the sample chamber, air was introduced into the chamber, and a plasma struck by applying an appropriate voltage. The air pressure was adjusted to 1.2 Torr in the plasma region. This treatment with an $O_2$ containing gas was continued for 5 minutes at a power density of approximately 10 milliwatts/cm$^3$. (The $O_2$ plasma cleaned the organic residues from the exposed surface of the sample.) The chamber was then again evacuated to below 1 Torr. A mixture of 93% $CF_4$ and 7% $O_2$ was introduced into the chamber. Upon introduction of the etching gas, the plasma was struck by applying an appropriate voltage. The gas pressure was adjusted until the pressure in the plasma region was about 0.6 Torr. The etch was continued for 35 minutes at a power density level of approximately 17 milliwatts/cm$^3$.

This produced etch pits of approximately 3500 Å depth and an undercutting of similar dimension. The samples were removed from the etching chamber and without removing the photoresists, the samples were then transferred to the sample holder of a conventional planetary evaporator, the target utilized in this evaporator was an alloy of 81% aluminum and 19% copper. An electron beam density sufficient to yield an evaporation rate of approximately 1000 Å/min. was utilized. The evaporation was continued until a total aluminum alloy thickness of 3500 Å was obtained. The alloy obtained on the etched silicon dioxide layer had a composition of 4½% copper and 95½% Al by weight. The samples were removed from the evaporator and were immersed in acetone that was heated to approximately 40 degrees C. The bath was ultrasonically agitated using a conventional low power agitator. This treament effectively removed the resist and any metal overlaying the resist. The samples were removed from the bath and sprayed with acetone to remove any particulate matter. The samples were then plasma cleaned with $O_2$ as described previously. However, the cleaning gas was a mixture of 96% He and 4% $O_2$ at a pressure of 1 Torr as measured in the plasma region.

The sample was then placed in a conventional diode sputtering system. Using the deposition conditions previously described, a silicon dioxide layer thickness of approximately 1000 Å was sputtered onto the samples. After sputter deposition, the samples were cleaned by brush scrubbing with an aqueous detergent. Permalloy in the pattern indicated by the unshaded region in FIG. 8, was deposited onto the second silicon dioxide layer using a conventional electron beam evaporation, photolithography, and ion beam etching techniques.

Figure 9:
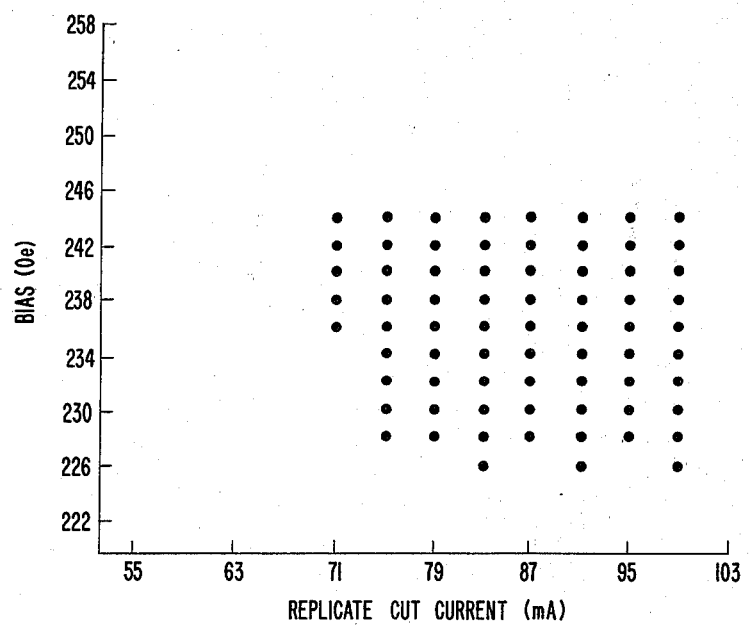

A drive field of approximately 60 Oe was applied to the device. Varying bias fields were imparted to the device and the current necessary at each bias level to produce bubble replication was measured. The results obtained are shown in FIG. 9. As can be seen, an excellent range of acceptable operation was achieved. By contrast, the replication function was inoperable over the same range of parameters when fabricated in a conventional non-planar structure.

EXAMPLE 2

A garnet epilayer having a 2500 Å thick $SiO_2$ layer was utilized. This silicon dioxide layer was produced in a conventional CVD plasma reactor utilizing a sample temperature of 235 degrees C., a 50 KHz excitation at a power level of approximately 150 milliwatts/cm$^2$, and a plasma gas of 6% $SiH_4$, and 94% $N_2O$ composition. The procedure as described in Example 1 was utilized on this substrate except a resist thickness of 5000 Å was employed. The resist, after patterning was heated to a minimum temperature of approximately 120 degress C. for 15 minutes to flow the resist and produce rounded edges. The sample was cleaned and etched as described in Example 1 except a power density of 10 milliwatts/cm$^3$ was utilized with an etchant gas pressure in the plasma region of approximately 1 Torr. The etching was continued until the etch pit reached the underlying garnet epilayer. This etching procedure took approximately 6 minutes. The subsequent aluminum alloy deposition and metal lift-off procedure were as described in Example 1. The second silicon dioxide layer was deposited by the plasma enhanced CVD method as described previously in this example. A thickness for the second $SiO_2$ layer of approximately 1500 Å was utilized. The pattern of the initial aluminum alloy layer was as shown in FIG. 10. Conventional evaporation techniques, lithography and chemical etching procedures were utilized to fabricate the second aluminum alloy layer in the pattern shown in FIG. 11 onto this second silicon dioxide layer. In both cases, the patterned aluminum alloy layers in FIG. 10 and FIG. 11 were perforated sheets, the holes being represented by the small rectangles in each figure.

I claim:

1. A process for fabricating a device that relies on magnetic properties comprising the steps of forming an electrically conducting layer in a desired pattern on a first electrically insulating layer and depositing a second layer of electrically insulating material onto said metal layer CHARACTERIZED IN THAT said electrically conducting layer is formed by
   (a) masking said first electrically insulating layer with a delineating material having a thickness less than 1.5 μm such that the area left exposed by said delineating material forms said desired pattern,
   (b) subjecting said masked first electrically insulating layer to a media that etches said electrically insulating layer, to form an etch pit where the fraction obtained by dividing the distance said delineating material extends beyond the extremity of the wall of said etch pit by the depth of said etch pit is greater than or equal to Δ but smaller than or equal to 1.5,
   (c) depositing said metal in an appropriate thickness onto said masked first insulating layer such that an essentially planar geometry is formed substantially across the entire width of said etch pit, wherein there is a substantial absence of gaps between said deposited metal and the wall of said etch pit that extend to the bottom of said etch pit, and
   (d) removing said delineating materials.

2. The process of claim 1 wherein said first electrical insulator is $SiO_2$.

3. The process of claim 2 wherein said electrical conductor is an aluminum alloy.

4. The process of claim 3 wherein said aluminum alloy is Al-4.5% Cu by weight.

5. The process of claim 1 wherein said electrical conductor is an aluminum alloy.

6. The process of claim 1 wherein said first electrical insulator is etched by plasma etching.

7. The process of claim 1 wherein said device is a magnetic bubble device.

8. The process of claim 7 wherein a permalloy layer in a desired configuration is deposited on said second electrically insulating layer.

9. The process of claim 7 wherein a second electrically conducting layer in a desired configuration is deposited on said second electrically insulating layer.

* * * * *

United States Patent and Trademark Office
CERTIFICATE OF CORRECTION

PATENT NO. : 4,334,950
DATED : June 15, 1982
INVENTOR(S) : Bernard J. Roman

It is certified that error appears in the above—identified patent and that said Letters Patent is hereby corrected as shown below:

In the specification, Column 5, line 22 "$A_o$" should read --$\overset{o}{A}$--.
Column 6, line 53 "A" should read --$\overset{o}{A}$--.

In the claims, claim 1, column 8, line 1 "Δ" should read --1/3--.

Signed and Sealed this

Fourteenth Day of December 1982

[SEAL]

Attest:

Attesting Officer

GERALD J. MOSSINGHOFF

Commissioner of Patents and Trademarks